(12) United States Patent
Zhang et al.

(10) Patent No.: US 6,365,935 B1
(45) Date of Patent: Apr. 2, 2002

(54) TFT HAVING HYDROGEN CONTAINING BUFFER AND SUBSTRATE REGIONS

(75) Inventors: Hongyong Zhang; Takeshi Fukunaga, both of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/302,665

(22) Filed: Apr. 30, 1999

Related U.S. Application Data

(63) Continuation of application No. 08/789,089, filed on Jan. 27, 1997, now Pat. No. 5,946,585.

(30) Foreign Application Priority Data

Jan. 26, 1996 (JP) ............................................. 8-032871

(51) Int. Cl.[7] .............................................. H01L 29/00
(52) U.S. Cl. ..................... 257/347; 257/348; 257/349; 257/350; 257/351; 257/352; 257/353; 257/354; 257/355; 257/59
(58) Field of Search ................................ 257/347–355, 257/59, 66, 72

(56) References Cited

U.S. PATENT DOCUMENTS 3,849,204 A * 11/1974 Fowler ........................ 438/475
3,982,967 A * 9/1976 Ku et al. ...................... 438/357
4,447,272 A * 5/1984 Saks ............................. 438/287
5,304,509 A * 4/1994 Sopori .......................... 438/58
5,470,768 A * 11/1995 Yanai et al. ................... 437/40
5,543,336 A * 8/1996 Enami et al. ................. 438/528
5,574,293 A * 11/1996 Arai et al. .................... 438/59
5,591,988 A * 1/1997 Arai et al. .................... 257/66
5,620,906 A * 4/1997 Yamaguchi et al. ........ 438/162
5,633,174 A * 5/1997 Li .................................. 438/475
5,879,973 A * 3/1999 Yanai et al. ................. 438/161

FOREIGN PATENT DOCUMENTS

DD    259715      * 8/1988
JP    07-183532   * 12/1993 .................. 257/59

* cited by examiner

Primary Examiner—Fetsum Abraham
(74) Attorney, Agent, or Firm—Fish & Richardson P.C.

(57) ABSTRACT

There is disclosed a method of fabricating a semiconductor device having excellent characteristics. The device comprises a substrate having an insulating surface. A hydrogen-rich region is formed inside the substrate by ion doping. Thermal processing is performed at 300 to 450° C. to thermally diffuse hydrogen ions. Thus, dangling bonds and defect levels in an active layer are compensated. Since the hydrogenation from inside the semiconductor device is enabled in this way, hydrogen termination can be performed at a high efficiency.

28 Claims, 4 Drawing Sheets

TFT HAVING HYDROGEN CONTAINING BUFFER AND SUBSTRATE REGIONS

This Application is a Continuation of Ser. No. 08/789,089 filed Jan. 27, 1997, now U.S. Pat. No. 5,946,585.

BACKGROUND OF THE INVENTION

1. Field of the Invention

The present invention relates to a method of fabricating a semiconductor device, using a crystalline thin film and, more particularly, to a method of fabricating a planar thin-film transistor. Furthermore, the invention relates to a method of fabricating a liquid crystal display making use of such semiconductor devices.

2. Description of the Related Art

In recent years, technologies for fabricating field-effect thin-film transistors (TFTs) having excellent switching characteristics on substrates having poor thermal resistance, such as glass substrates and plastic substrates, have evolved, because with the development of techniques, amorphous silicon (a-Si) thin films and polysilicon (p-Si) thin films have been formed at lower temperatures.

At present, active matrix liquid crystal displays using a-Si thin films have become dominant in flat-display technology and almost form a vast field of the electronic industry.

In an active matrix liquid crystal display, millions of pixels are arranged in rows and columns, and TFTs are disposed at each pixel. Electric charge going into and out of each pixel electrode is controlled by the switching action of the TFTs.

TFTs using p-Si thin films have high field mobilities and operate at high speeds and so they permit fabrication of an integrated liquid crystal display incorporating peripheral driver circuits.

Accordingly, a liquid crystal display using p-Si thin film is recognized as a technique for accomplishing a next-generation, high performance intelligent display. It is considered that this technique will permit fabrication of an electronic system on glass (system-on-glass).

However, silicon films have their inherent problems. Amorphous silicon thin films and low-temperature p-Si thin films have high defect level densities due to dangling bonds and crystal grain boundaries. Therefore, when TFTs are manufactured, a hydrogenation step is necessary to conduct termination by hydrogen in the active layer.

Today, hydrogenation enjoys wide acceptance because it is effective in improving the electrical characteristics of TFTs such as mobilities, threshold voltages, off currents, and subthreshold swing factors. The hydrogenation is classified into two major methods: a method using thermal processing and a method using plasma processing.

In the former method using thermal processing, a substrate to be processed is heated in a hydrogen ambient at a temperature of 300–450° C. for tens of minutes to several hours to thermally diffuse hydrogen into the thin film.

In this method, in order to shorten the hydrogenation time and to lower the equipment cost, the thermal processing is preferably performed at atmospheric pressure in a 100% $H_2$ ambient. However, since hydrogen is very active (where certain content and environment temperature are exceeded, it explodes), the Industrial Safety Standard restricts the hydrogen content severely to 3–4% or less.

Accordingly, a method consisting of performing hydrogenation in an ambient of hydrogen diluted with an inert gas and a method consisting of carrying out hydrogenation at a low pressure of hundreds of torr have been proposed. Nevertheless, both methods suffer from low hydrogenation efficiency and offer only limited industrial practicability.

Another problem is that hydrogen diffuses itself into the active layer while kept in a molecular state and thus the probability that defect levels are terminated is not very high.

The latter method relies on plasma processing. Reactant gases such as $H_2$, $H_2+O_2$, and $NH_3$ are decomposed by a plasma discharge. The resulting hydrogen atoms are injected into the thin film.

In this case, the efficiency of hydrogenation is high but plasma damage and electrostatic discharge damage are induced. In addition, it is difficult to obtain optimum hydrogenation conditions.

SUMMARY OF THE INVENTION

It is an object of the present invention to provide a method of fabricating a semiconductor device, using a highly efficient hydrogenation method.

It is another object of the invention to provide TFTs having electrical characteristics which are improved by increasing the effects of hydrogenation.

In view of the foregoing problems, we have analyzed the prior art hydrogenation techniques and found that the following items play key roles in solving these problems.

(1) The diffusivity of hydrogen differs according to the material through which hydrogen diffuses. In the above-described method where hydrogen is diffused from outside, the amount of hydrogen reaching the active layer differs widely according to the material of the overlying layer. Therefore, it is important to perform hydrogen termination in an early stage of TFT fabrication process.

(2) Even if the active layer is terminated with hydrogen in an early stage of TFT fabrication process, hydrogen leaves the active layer at a certain probability when the layer is heated only to about 350° C. Consequently, a hydrogen source for constantly replenishing hydrogen lost is necessary.

Accordingly, a method according to the invention is intended to provide a method of fabricating a semiconductor device on a substrate or base having an insulating surface, the method consisting of a first and a second steps. The first step consists of forming a region with a certain hydrogen content under an active layer that forms the semiconductor device. The second step consists of performing thermal processing to diffuse the hydrogen into the semiconductor device. The region formed by the first step is used as a hydrogen source. During the second step, the semiconductor device is hydrogenated, using this hydrogen source.

More specifically, the region with a higher hydrogen content than other regions has been previously formed under the active layer. Hydrogen termination is performed, using hydrogen supplied from inside, i.e., using the hydrogen-rich region as a hydrogen source. For this purpose, a heat treatment is made at a temperature of 300–450° C. to thermally diffuse hydrogen out of the hydrogen source.

At this time, hydrogen ion implantation should be done without damaging a region which will become a channel later. For example, if the device is a normal staggered or normal planar TFT, the hydrogen ion implantation may be done after formation of a gate electrode. If the device is an inverse-staggered or inverted planar device, the implantation may be effected prior to the formation of the active layer.

For this reason, the hydrogen ion implantation is required to achieve considerable implantation depth. Consequently, use of ion doping is favorable. At this time, the dose is adjusted to be 1E15 to 1E17/cm².

Hydrogen ions introduced by ion doping collide with other atoms, so that energy is imparted to the hydrogen ions. Therefore, these hydrogen ions exist in atomic state. Hence, they can passivate the active layer efficiently.

Furthermore, the heat treatment for the hydrogen termination does not depend on the ambient because the hydrogen source is present under the active layer. This assures a stable hydrogenation efficiency. Moreover, this heat treatment can also perform the functions of other processing steps carried out at temperatures of 300–450° C., because the heat treatment is independent of the processing environment.

The present invention also provides a method of fabricating a semiconductor device on a substrate or base having an insulating surface, the method comprising a first, a second, and a third processing steps. The first step consists of forming a region with a given hydrogen content under an active layer that forms the semiconductor device. The second step consists of forming an interlayer dielectric film from silicon nitride over the active layer. The third step consists of performing thermal processing to diffuse hydrogen into the semiconductor device. The region formed by the first step is used as a hydrogen source, and the semiconductor device is hydrogenated by the third step.

Since the diffusivity of hydrogen differs according to the material through which the hydrogen is diffused, if hydrogen is diffused from outside as in the prior art techniques, the amount of hydrogen reaching the active layer is affected greatly by the material of the overlying layer. Our experience shows that if the interlayer dielectric film is made of a silicon nitride film, hydrogen is blocked by this layer, making it difficult for the hydrogen to arrive at the active layer.

However, if hydrogen termination is performed before the silicon nitride film is formed over the active layer, there arises the problem that hydrogen leaves the active layer with a certain probability simply by heating the film to about 350° C. in a later processing step.

In the present invention, a hydrogen ion source exists under the active layer and so the supplied ions are not blocked by the silicon nitride film or the like. Hence, a stable hydrogenation efficiency can be assured. Furthermore, the hydrogen ions from the hydrogen ion source can continually replenish hydrogen lost.

Since the hydrogen ions are diffused from inside the semiconductor device, if the silicon nitride film is used as an interlayer dielectric film, it also acts as a barrier film which blocks the hydrogen ions from escaping from the semiconductor device.

Accordingly, the interior of the device structure has a higher hydrogen content than TFTs fabricated by an ordinary hydrogenation method. Especially, where a silicon nitride film is used as a barrier film, the hydrogen ion content at the lower surface of the barrier film tends to be high.

While the configuration of the present invention has been described, the invention will be described in further detail, using its preferred embodiments.

DETAILED DESCRIPTION OF THE PREFERRED EMBODIMENTS

Embodiment 1

Figure 1A:
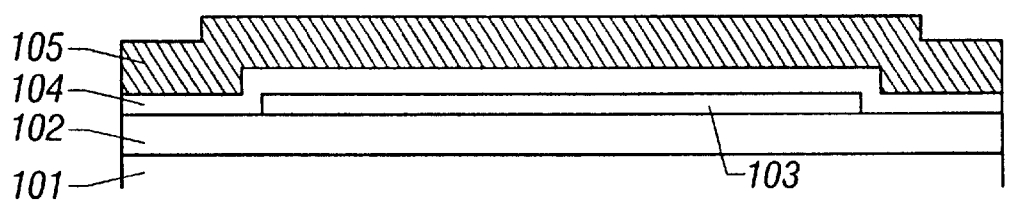
FIGS. 1(A)–1(D) are views illustrating processing steps for fabricating a TFT.

Processing steps of the present embodiment for fabricating thin-film transistors (TFTs) according to the invention are shown in FIGS. 1(A)–1(D). The present embodiment shows a normal planar TFT. It is to be noted that the invention is not limited to this type. Rather, it can also be applied to inverted-planar type, normal staggered type, inverted-staggered type, and other types.

First, a glass substrate 101 typified by Corning 7059 is prepared. Of course, a quartz substrate or semiconductor material having an insulating surface may also be employed. Where the glass substrate is used, if thermal processing is previously performed around the strain point of the glass substrate, then shrinkage of the glass can be suppressed during later heating steps.

Then, a buffer layer 102 consisting of a silicon oxide film is formed to a thickness of 2000 Å. This film may be formed by sputtering or plasma CVD. An amorphous silicon film (not shown) is formed on the buffer layer to a thickness of 200 to 500 Å by plasma CVD or LPCVD. In the present embodiment, the a-Si film is grown to a thickness of 500 Å by plasma CVD.

In the present embodiment, an example of TFT using a thin film of polysilicon is described. The present invention can also be applied to TFTs using thin film of amorphous silicon. In the latter case, the following crystallization step is not necessary.

Thereafter, an amorphous silicon film is crystallized by an appropriate crystallization method. This crystallization is carried out by a heat treatment at 550–650° C. for 1 to 24 hours or by UV laser light irradiation at a wavelength of 193, 248, or 308 nm. At this time, both methods can be used in conjunction. An element for promoting the crystallization such as Ni may be added.

Then, the crystalline silicon (polysilicon) film obtained by crystallizing the amorphous silicon film is patterned into islands of a semiconductor layer, or an active layer 103.

A silicon oxynitride ($SiO_xN_y$) film 104 having a thickness of 1200 Å is formed on the active layer by plasma CVD. This silicon oxynitride film 104 will act as a gate-insulating film later. Instead, a silicon oxide film or silicon nitride film may be used.

Subsequently, an aluminum film 105 to which 0.2% by weight of scandium is added is formed to a thickness of 4000 Å by dc sputtering. The addition of the scandium is effective in preventing generation of hillocks and whiskers on the surface of the aluminum film 105. This aluminum film 105 will act as a gate electrode 108 later.

Instead of the aluminum film 105, other metal-based material such as Mo, Ti, Ta, or Cr may be used. Furthermore, polysilicon or a conductive film such as silicide-based material may be employed.

Then, anodization is carried out within an electrolytic solution, using the aluminum film 105 as an anode. The electrolytic solution is prepared by neutralizing ethylene glycol solution of a 3% tartaric acid with aqueous ammonia so that the pH is adjusted to 6.92.

A platinum cathode is used. An electrical current of 5 mA is passed. The voltage is increased up to 10 V.

In this way, a dense anodic oxide film (not shown) is formed. This anodic oxide film serves to improve the adhesion to photoresist deposited later. The film thickness can be controlled by controlling the voltage application time (FIG. 1(A)).

After obtaining a state of FIG. 1(A), the aluminum film 105 is patterned, using a mask of photoresist, to create a template for the gate electrode 108 formed later. Second anodic oxidation is carried out to form a porous anodic oxide film 106. An aqueous solution of a 3% oxalic acid is used as an electrolytic solution. A platinum cathode is employed. An electrical current of 2–3 mA is passed. The voltage is increased up to 8 V.

At this time, the anodization proceeds in a direction parallel to the substrate. The length of the porous anodic oxide film 106 can be controlled by controlling the voltage application time.

Then, the photoresist is removed with a proprietary stripping solution, followed by execution of third anodization. Thus, a state shown in FIG. 1(B) is obtained.

At this time, the used electrolytic solution is prepared by neutralizing ethylene glycol solution of a 3% tartaric acid with aqueous ammonia so that the pH is adjusted to 6.92. A platinum cathode is used. An electrical current 5–6 mA is passed. The voltage is increased up to 100 V.

At this time, a very dense and tough anodic oxide film 107 is formed. Therefore, this film protects the gate electrode 108 against damage in subsequent processing steps such as doping step. The tough anodic oxide film 107 is resistant to etching and so when a contact hole is formed, the etching time is prolonged. For this reason, the thickness is preferably set less than 1000 Å.

Figure 1B:
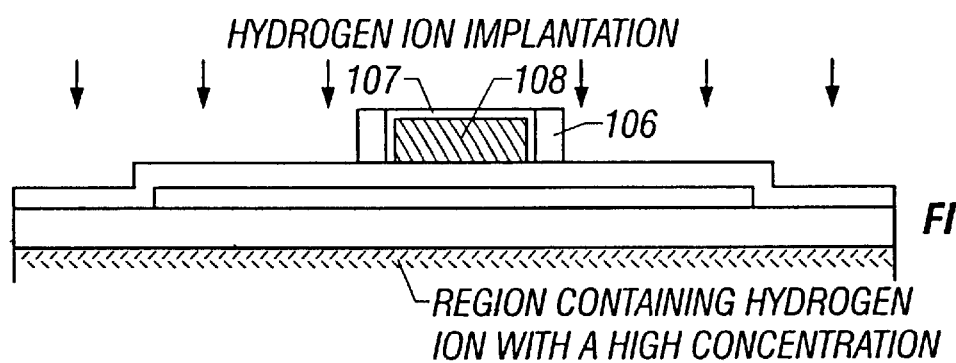

Then, as shown in FIG. 1(B), hydrogen ions are implanted into the whole surface of the substrate by ion doping. Since the area of the gate electrode 108 is small compared with the whole surface of the substrate, it is not necessary to take account of the effects of the gate electrode 108 in calculating the hydrogen ion implantation depth. In the present embodiment, the ion implantation step is carried out under the following conditions:

dopant gas: 100% $H_2$
applied electric power: 20 to 100 W
applied voltage: 40 to 100 KeV
dose: 1E15–1E17/cm$^2$
processing temperature: room temperature The hydrogen ion-rich region formed under the above-described conditions will act as a hydrogen ion source in a later hydrogenation step that is a thermal processing step for thermally diffusing hydrogen ions. Therefore, the dose is preferably in excess of 5E15/cm$^2$.

It is to be noted that the processing temperature is not limited to room temperature. It is also possible to heat the substrate in performing the ion implantation. In this case, however, even if the treatment is made at room temperature, the ion implantation increases the temperature of the substrate itself and so it may be heated to about 200° C. by itself. Accordingly, where the processing is done while heating the substrate, it is necessary to take account of this self-temperature rise and the temperature at which hydrogen is released. Thus, care must be taken that the substrate is not heated to above 450° C.

The implanted hydrogen ions are activated and released from the substrate even if they are heated to about 350° C. Therefore, when phosphorus (P) ions and boron (B) ions which are implanted later are activated, especially, when laser irradiation is utilized for the activation, the active layer 103 absorbs heat and gets hot. Consequently, the hydrogen ions leave the substrate violently.

Figure 5:
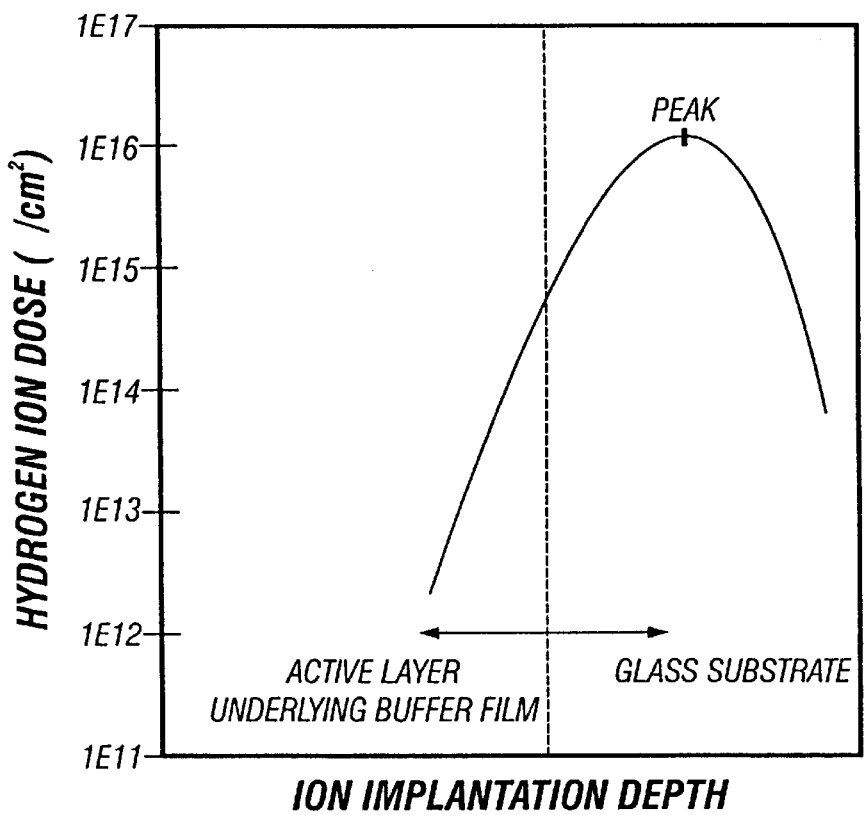
FIG. 5 is a diagram showing a hydrogen content distribution.

For this reason, the dose distribution of the hydrogen ions is so adjusted that its peak lies at a position invariably deeper than the active layer 103. If the hydrogen content of the buffer layer 102 consisting of silicon oxide is too high, the quality of the film is deteriorated. Therefore, the peak is preferably located deeper than the interface between the glass substrate 101 and the buffer layer 102. FIG. 5 shows the depth distribution of hydrogen dose evaluated by SIMS analysis.

Where hydrogen ion implantation is done, self-temperature rise of the substrate is induced by the collision of the hydrogen ions. It follows that subsequent dopant implantation causes hot doping, i.e., the implantation is performed while the substrate is being heated. The hot doping reduces the energy necessary for the dopant activation step, thus producing a secondary advantage.

Then, a dopant is implanted into the active layer 103 while the structure shown in FIG. 1(B) is maintained. For example, if an N-channel TFT should be fabricated, phosphorus (P) is used as the dopant. If a P-channel TFT should be manufactured, boron (B) is used as the dopant. In the present embodiment, a case where an N-channel TFT is built is described.

First, under the condition of FIG. 1(B), first ion implantation is carried out. Phosphorus (P) is implanted at an accelerating voltage of 60 to 90 kv with a dose of 0.2 to $5 \times 10^{15}$ atoms/cm$^2$. In the present embodiment, the accelerating voltage is 80 kV and the dose is $1 \times 10_{15}$ atoms/cm$^2$.

Figure 1C:
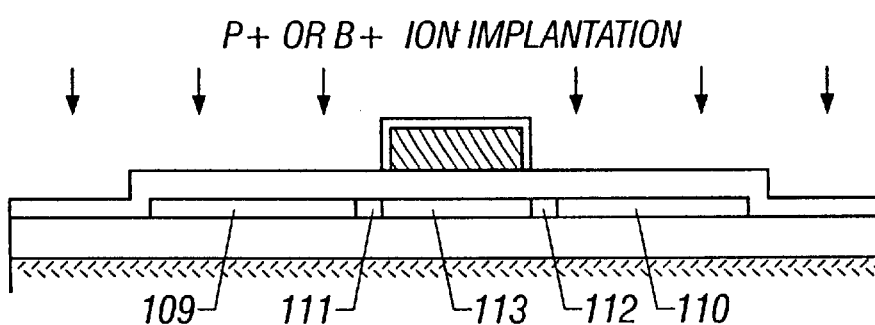

As a result, regions 109 and 110 which will become source/drain regions are formed by self-aligned technology while the gate electrode 108 and the porous anodic oxide film 106 are used as a mask (FIG. 1(C)).

Then, as shown in FIG. 1(C), the porous anodic oxide film 106 is removed. Second ion implantation is done at an accelerating voltage of 60 to 90 kV with a dose of 0.1 to $5 \times 10^{14}$ atoms/cm$^2$. In the present embodiment, the accelerating voltage is 80 kV and the dose is $1 \times 10_{14}$ atoms/cm$^2$.

Then, the gate electrode 108 becomes a mask. Lightly doped regions 111 and 112 of a lower doping level than the source region 109 and drain region 110 are formed by self-aligned technology. At the same time, no dopant is implanted at all immediately under the gate electrode 108. Therefore, a region 113 acting as the channel of the TFT is formed by self-aligned technology.

The lightly doped region (referred to as LDD region) 112 acts to suppress development of a high electric field between the channel region 113 and the drain region 110.

In this way, a state shown in FIG. 1(C) is obtained. Then, a KrF excimer laser light irradiation and thermal annealing are carried out. In the present embodiment, the energy density of the laser light is 250 to 300 mJ/cm$^2$. The thermal annealing is performed at 300 to 450° C. for 1 hour. This processing step can improve the crystallinity of the active layer 103 damaged by the ion doping step.

Subsequently, a silicon nitride film is formed as an interlayer dielectric film 114 to a thickness of 3000 to 5000 Å by plasma CVD. Preferably, the interlayer dielectric film 114 is a film of silicon nitride. The film 114 may also be made of silicon oxide. Furthermore, the interlayer dielectric film 114 may be a multilayer structure (FIG. 1(D)).

After forming the interlayer dielectric film 114, the hydrogen ions injected by the previous step are thermally diffused. This processing step performs the same purpose as the conventional hydrogenation step. The thermal treatment is carried out at 350° C. for 2 hours in a $N_2$ ambient (or in an ambient of less than 5% $H_2$). The inside of the processing chamber is at atmospheric pressure.

Especially, where the thermal treatment is conducted in a $H_2$ ambient, the efficiency of hydrogenation is enhanced. In addition, the stress in the thin film deposited on the glass substrate is relieved. Consequently, even under atmospheric-pressure, low-hydrogen-content conditions which would have provided low efficiencies, sufficient advantages including additional merits can be obtained.

In the present embodiment of hydrogenation step, the hydrogen source exists inside the substrate and so this processing step is substantially independent of the processing ambient. Accordingly, this processing step can also perform the functions of other processes which are carried out at temperatures of 300–450° C.

If the aforementioned interlayer dielectric film 114 is deposited, for example, at 300–450° C., and if the processing time permits sufficient thermal diffusion of the hydrogen ions, then it is not necessary to perform an independent thermal diffusion step.

It is to be understood, however, that where the hydrogenation is carried out after the formation of the interlayer dielectric film, hydrogen is supplied from inside the interlayer dielectric film and so the entering hydrogen is not blocked by the interlayer dielectric film unlike in the prior art technique, where the interlayer dielectric film (especially if it is made of a silicon nitride film) is a barrier against the hydrogen. Conversely, the interlayer dielectric film has the advantage that it confines the hydrogen within the film and prevents the hydrogen from escaping to the outside.

After the end of the hydrogenation step, a contact hole is formed in the interlayer dielectric film 114. A source interconnect 115, a drain interconnect 116, and a gate interconnect 117 are formed from a lamination layer of an aluminum-based material and titanium.

Figure 1D:
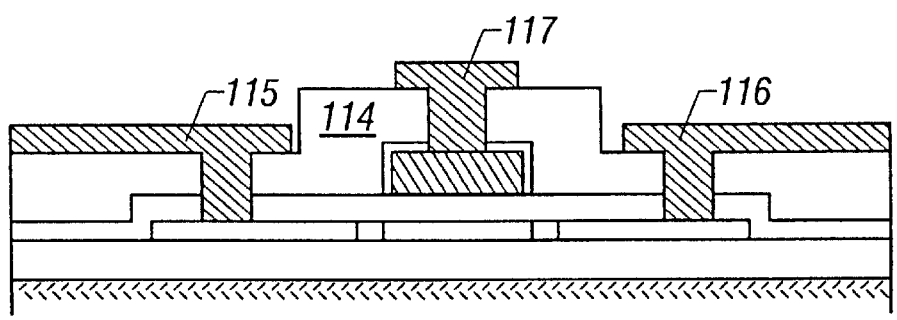

As a result of the processing steps described thus far, a TFT as shown in FIG. 1(D) is fabricated. In the hydrogenation process according to the present invention, hydrogen supplied from inside the substrate assumes an active atomic state. In consequence, the efficiency of hydrogen termination is much higher than that of the prior art hydrogenation utilizing hydrogen molecules.

The TFT of the structure fabricated according to the present embodiment has excellent electrical characteristics as given below.

field mobility: 100 to 150 $cm^2/Vs$ for N-channel TFT
60 to 80 $cm^2/Vs$ for P-channel TFT
threshold voltage: 1 to 2 V for N-channel TFT
−2 to −3 V for P-channel TFT
subthreshold swing factor: 0.2 to 0.4 V/decade
off current: less than 10 pA
Since the hydrogen source is incorporated within the substrate, deterioration due to heat can be reduced. For example, if a completed TFT is thermally treated at 400° C. for 1 hour, the mobility and the threshold value vary within 2%.

Embodiment 2

The present embodiment shows an example where a hydrogen ion-introducing step and implantation of a conductivity type-imparting dopant such as phosphorus or boron are carried out simultaneously. The processing steps for the TFT are similar to those of Embodiment 1 except for the following points.

As an example, where an N-channel TFT is fabricated, phosphorus (P) is used as a dopant. At this time, if a dopant gas including hydrogen as its constituent such as phosphine ($PH_3$) is used, hydrogen can be introduced together with the dopant.

Also, if $H_2$ is used as a gas diluting the dopant gas, hydrogen ions can be readily introduced with a high dose. Furthermore, the hydrogen content of the ion-implanted substrate can be controlled by adjusting the ratio of the dilution.

In the ion implantation using a gas as described above, the resulting distribution of the hydrogen ions has a peak at a position much deeper than the distribution of the dopant ions because hydrogen ions are much lighter than the dopant ions.

The dopant and hydrogen ions should be implanted under conditions meeting the requirements given in Embodiment 1. The hydrogen ions may be introduced with a desired concentration by varying the ion implantation conditions, the concentration of the diluting gas, etc.

In the present embodiment, the hydrogen ion implantation step and the doping step can be carried out simultaneously. Therefore, the process can be greatly simplified. Moreover, damage to the device during the ion implantation is reduced.

Embodiment 3

The present embodiment shows an example of active matrix liquid crystal display equipped with TFTs fabricated by making use of the present invention. A process sequence for fabricating a pixel TFT arranged in the pixel region and a circuit TFT arranged in the peripheral driver circuit are next described briefly by referring to FIGS. 2(A)–2(E).

First, a glass substrate 201 typified by Corning 7059 glass is prepared. Of course, a quartz substrate or semiconductor material having an insulating surface may also be employed. Then, a buffer layer 202 consisting of a silicon oxide film is formed to a thickness of 2000 Å. This film may be formed by sputtering or plasma CVD.

An amorphous silicon film (not shown) is formed on the buffer layer to a thickness of 200 to 500 Å by plasma CVD or LPCVD. In the present embodiment, this film is grown to a thickness of 500 Å by plasma CVD.

Thereafter, an amorphous silicon film (not shown) is crystallized by an appropriate crystallization method. This crystallization is carried out by a heat treatment at 550–650° C. for 1 to 24 hours or by UV laser light irradiation at a wavelength of 193, 248, or 308 nm. At this time, both methods can be used in conjunction. An element for promoting the crystallization such as Ni may be added.

Then, the crystalline silicon film obtained by crystallizing the amorphous silicon film is patterned into islands of semiconductor layers, or active layers, 203 and 204.

A silicon oxynitride ($SiO_xN_y$) film 205 having a thickness of 1200 Å is formed on the active layers by plasma CVD. This silicon oxynitride film 205 will act as a gate-insulating film later. Instead of this silicon oxynitride film, a silicon oxide film or silicon nitride film may be used.

Subsequently, an aluminum film 206 to which 0.2% by weight of scandium is added is formed to a thickness of 4000 Å by dc sputtering. The addition of the scandium is effective in preventing generation of hillocks and whiskers on the surface of the aluminum film. This aluminum film 206 will act as a gate electrode later.

Instead of the aluminum film, other metal-based material such as Mo, Ti, Ta, or Cr may also be used. Furthermore, polysilicon or a conductive film such as silicide-based material may be employed.

Then, anodization is carried out within an electrolytic solution, using the aluminum film 206 as an anode. The electrolytic solution is prepared by neutralizing ethylene glycol solution of a 3% tartaric acid with aqueous ammonia so that the pH is adjusted to 6.92.

A platinum cathode is used. An electrical current of 5 mA is passed. The voltage is increased up to 10 V.

In this way, a dense anodic oxide film (not shown) is formed. This anodic oxide film serves to improve the adhesion to photoresist deposited later. The film thickness can be controlled by controlling the voltage application time (FIG. 2(A)).

Figure 2A:
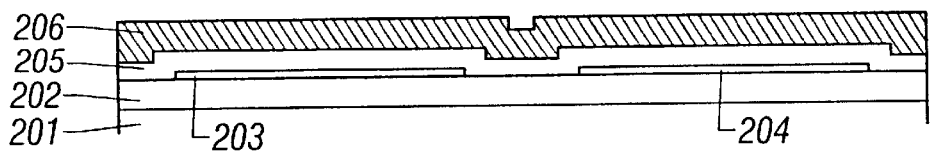
FIGS. 2(A)–2(E) are views illustrating processing steps for fabricating TFTs.

After obtaining a state of FIG. 2(A), the aluminum film 206 is patterned to create a template for a gate electrode formed later. Second anodic oxidation is carried out to form a porous anodic oxide film, 207 and 208 (FIG. 2(B)). An aqueous solution of a 3% oxalic acid is used as an electrolytic solution. A platinum cathode is used. An electrical current of 2–3 mA is passed. The voltage is increased up to 8 V.

At this time, the anodization proceeds in a direction parallel to the substrate. The length of the porous anodic oxide film, 207 and 208, can be controlled by controlling the voltage application time.

Then, the photoresist is removed with a proprietary stripping solution, followed by execution of third anodization. At this time, the used electrolytic solution is prepared by neutralizing ethylene glycol solution of a 3% tartaric acid with aqueous ammonia so that the pH is adjusted to 6.92. A platinum cathode is used. An electrical current 5–6 mA is passed. The voltage is increased up to 100 V.

At this time, a very dense and tough anodic oxide film, 209 and 210, is formed. Therefore, this film protects the gate electrodes 211, 212 against damage in subsequent processing steps such as doping step. The tough anodic oxide film, 209 and 210, is resistant to etching and so when contact holes are formed, the etching time is prolonged. For this reason, the thickness is preferably set less than 1000 Å.

Figure 2B:
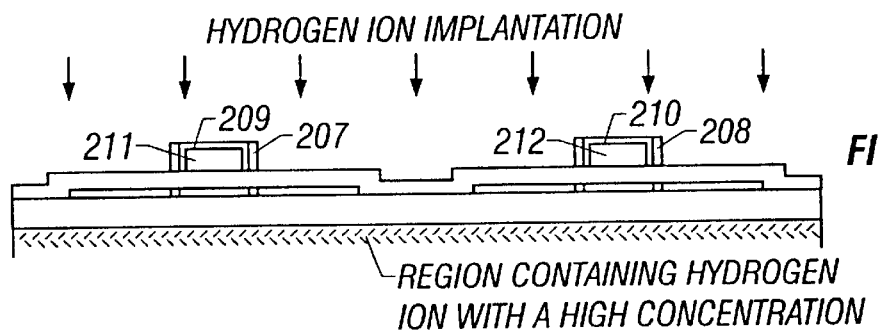

Then, as shown in FIG. 2(B), hydrogen ions are introduced into the whole surface of the substrate by ion doping. The process of the present embodiment is carried out under conditions similar to the conditions described in Embodiment 1 but hydrogen ion implantation is performed in a processing step different from a processing step for incorporating phosphorus (P) or boron (B). Of course, these two processing steps may be effected simultaneously similarly to Embodiment 2, in which case the following dopant implantation step is not necessary.

After the end of the hydrogen ion implantation, a dopant is introduced into the active layer, 203 and 204, by ion doping. For example, where an N-channel TFT is fabricated, phosphorus (P) is used as the dopant. Where a P-channel TFT is manufactured, boron (B) is used as the dopant.

The conditions under which the ions are implanted have been already described in detail in Embodiment 1 and thus will not be described in the present embodiment. As a result of this ion implantation, a state shown in FIG. 2(C) is obtained.

Figure 2C:
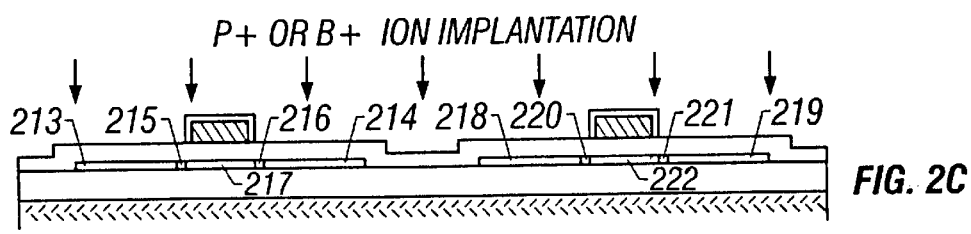
Figure 2D:
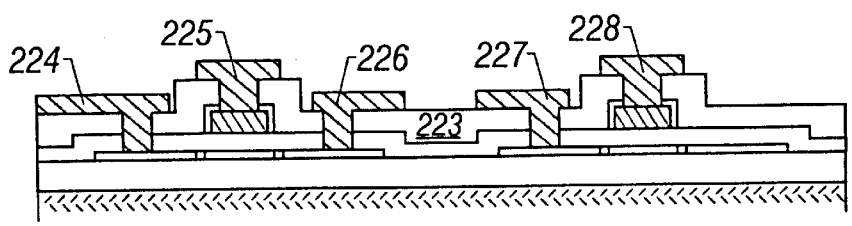

As shown in FIG. 2(C), source/drain regions 213, 214, lightly doped regions 215, 216, a channel-forming region 217 for a circuit TFT and source/drain regions 218, 219, lightly doped regions 220, 221, and a channel-forming region 222 for a pixel TFT are formed by self-aligned technology.

After deriving a state shown in FIG. 2(C), a KrF excimer laser light irradiation and thermal annealing are carried out.

In the present embodiment, the energy density of the laser light is 250 to 300 mJ/cm². The thermal annealing is performed at 300 to 450° C. for 1 hour. This processing step can improve the crystallinity of the active layer, 203 and 204, damaged by the ion doping step.

Subsequently, a silicon nitride film or silicon oxide film is formed as a first interlayer dielectric film 223 to a thickness of 3000 to 5000 Å by plasma CVD. The interlayer dielectric film 223 may be a multilayer structure (FIG. 2(D)).

After forming the interlayer dielectric film 223, the hydrogen ions introduced by the previous step are thermally diffused. This processing step performs the same purpose as the conventional hydrogenation step. The thermal treatment is carried out at 350° C. for 2 hours in a $N_2$ ambient or in a 3% $H_2$ ambient in the same way as in Embodiment 1. The inside of the processing chamber is at atmospheric pressure.

After the end of the hydrogenation step, the interlayer dielectric film which is coated on the source region 213, gate electrode 211, and drain region 214 for the circuit TFT and also on the source region 218 and gate electrode 212 for the pixel TFT is etched, thus forming contact holes.

Then, a source interconnect 224, a gate interconnect 225, a drain interconnect 226 for the circuit TFT and a source interconnect 227 and a gate interconnect 228 for the pixel TFT are formed from a lamination film of an aluminum-based material and titanium.

Thereafter, a silicon nitride film or silicon oxide film is formed as a second interlayer dielectric film 229 to a thickness of 3000 to 5000 Å by plasma CVD. This interlayer dielectric film 229 may assume a multilayer structure (FIG. 2(E)).

Figure 2E:
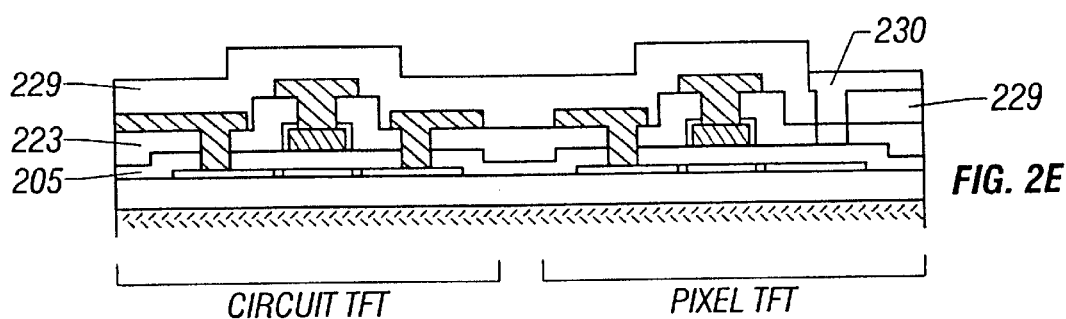

After forming the second interlayer dielectric film 229, interlayer dielectric films 229, 223 and the silicon oxynitride film 205 on the drain region 219 of the pixel TFT are etched, thus forming a contact hole. A pixel electrode 230 is formed from a transparent conductive film. In this way, a circuit TFT and a pixel TFT as shown in FIG. 2(E) are created.

Figure 3:
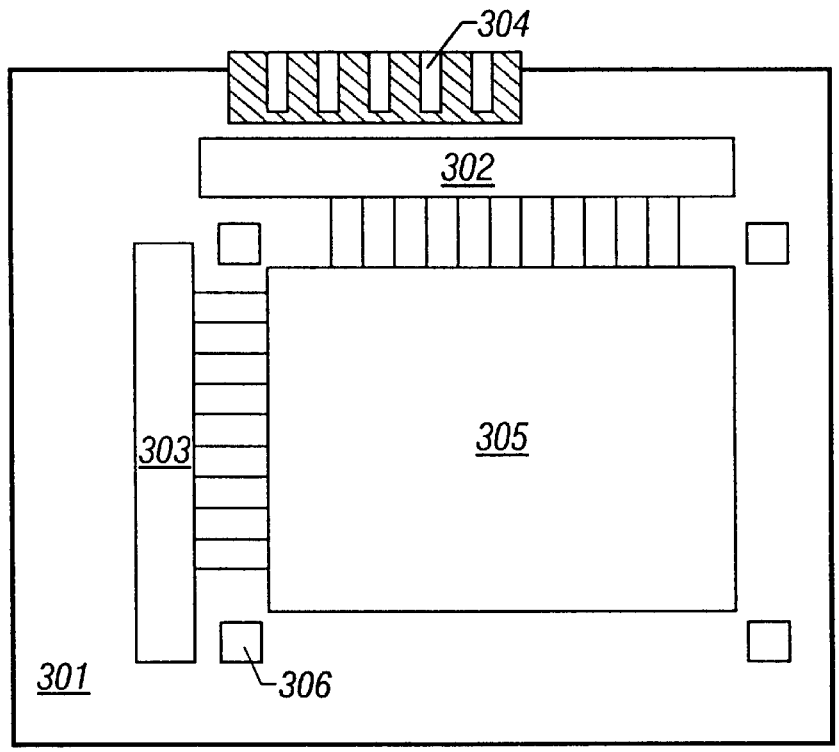
FIG. 3 is a view showing an integrated liquid crystal display incorporating a peripheral driver circuit.

An active matrix liquid crystal display where circuit TFTs and pixel TFTs as described thus far are arranged is schematically shown in FIG. 3. Shown in this figure are a glass substrate 301, a horizontal scanning circuit 302, and a vertical scanning circuit 303.

Image signals are accepted from outside via an input terminal 304 and sent to the pixel electrodes through switching devices that are the pixel TFTs controlled by the horizontal scanning circuit 302 and vertical scanning circuit 303. An image is displayed on a pixel region 305 by varying the electrooptical characteristics of a liquid crystal material sandwiched between each pixel electrode and a counter substrate. A common electrode 306 applies a given voltage to the counter substrate.

The apparatus shown in FIG. 3 operates in the manner described briefly above to display an image, and is a compact, high-performance panel whose peripheral circuit operates at a frequency above 3 MHz and whose display circuit shows a contrast ratio of more than 100.

Figure 4A:
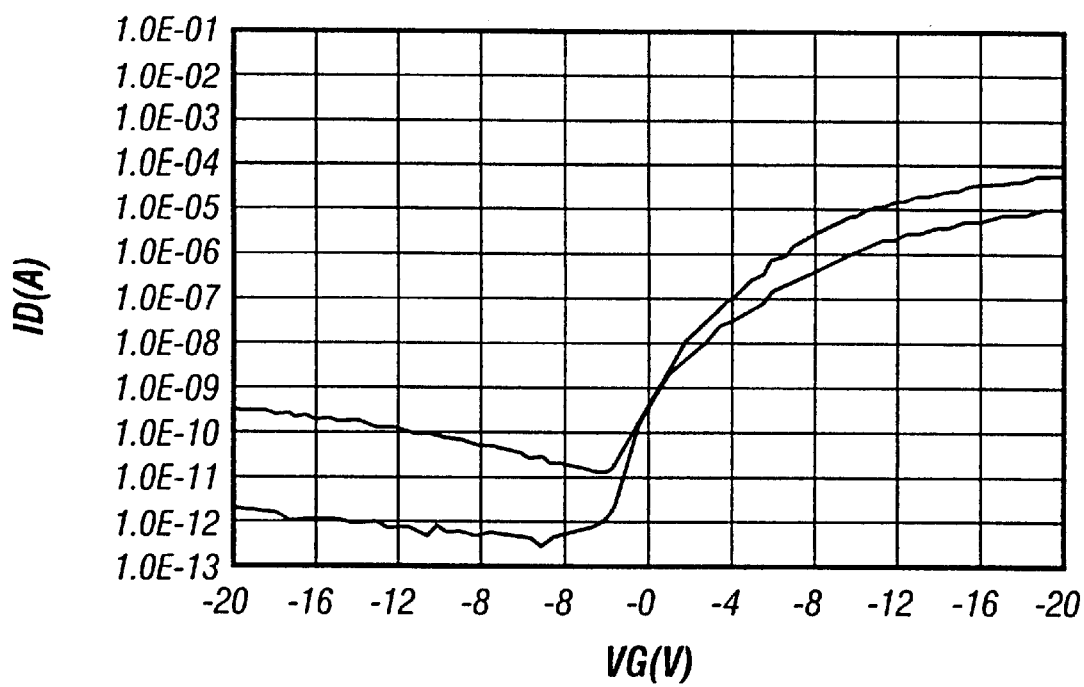
FIGS. 4(A) and 4(B) are diagrams illustrating electrical characteristics of TFTs.
Figure 4B:
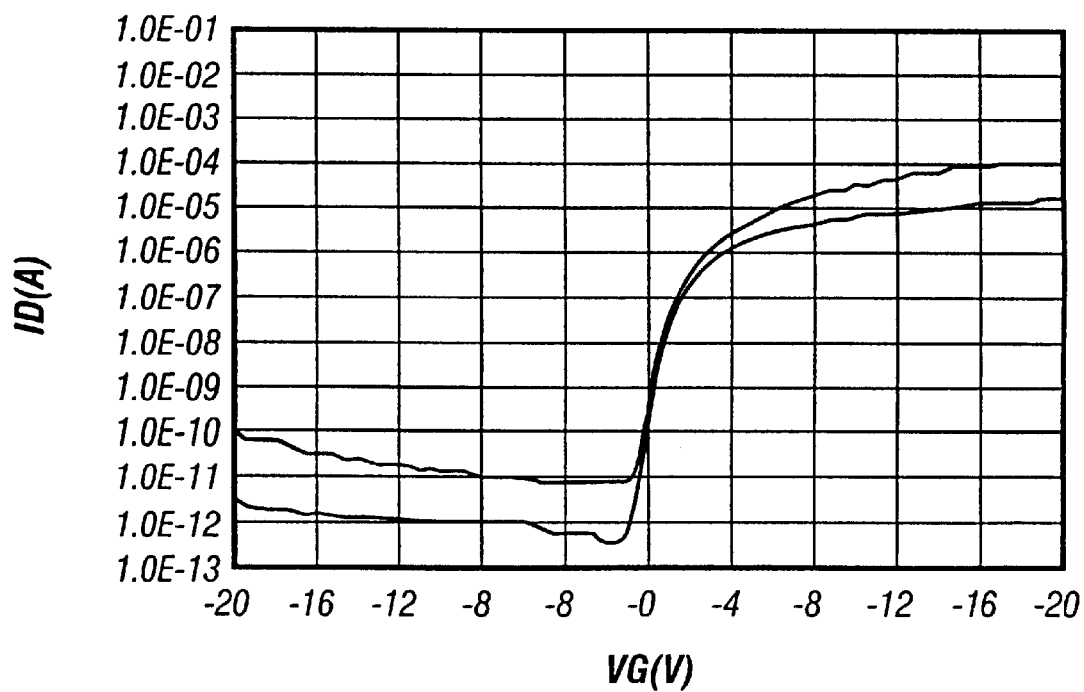

It has been confirmed that the pixel TFTs fabricated according to the present embodiment exhibit much better electrical characteristics than those of convectional pixel TFTs. Data about the electrical characteristics we have found is shown in FIGS. 4(A) and 4(B). In each of these graphs, a gate voltage is plotted on the horizontal axis and a drain current on the vertical axis. FIG. 4(A) shows data about the electrical characteristics of a TFT fabricated by the prior art hydrogenation method. FIG. 4(B) shows data about the electrical characteristics of a TFT fabricated by the novel hydrogenation method.

Compared to FIG. 4(A), the drain current shown in FIG. 4(B) shows a substantially ideal characteristic that rises at around 0 V and steeply, which means that the subthreshold swing factor is good.

The data given in FIG. 4(A) indicates that the threshold voltage is 5.86 V, while the data given in FIG. 4(B) indicates that the threshold voltage is as small as 1.72 V. This means that the electric power consumed when an image is displayed is reduced. Furthermore, the subthreshold swing factor is improved greatly from 0.94 V/decade (FIG. 4(A)) to 0.37 V/decade (FIG. 4(B)) and, therefore, an improvement in image response speed can be accomplished.

According to the present invention, the crystallinity of an active layer is improved after hydrogen ions are introduced. The hydrogen ions are thermally diffused to terminate defect levels with the hydrogen ions. Therefore, the substrate can be protected from damage during hydrogenation step. Furthermore, if the hydrogen atoms leave the active layer, they can be immediately replenished from a hydrogen source. Hence, stable electrical characteristics can be obtained at all times.

If the hydrogenation is performed after the formation of the interlayer dielectric film, hydrogen is supplied from inside the interlayer dielectric film and so easy entry of hydrogen is assured; in the prior art technique, entry of hydrogen is hindered by an interlayer dielectric film, especially a silicon nitride film. Conversely, in the present invention, the interlayer dielectric film forms a barrier against hydrogen which would otherwise escape to the outside.

Moreover, the present invention provides a hydrogen termination process which is much more efficient than the prior art process, because in the novel method, hydrogen supplied from inside the substrate takes an active atomic state, whereas in the prior art technique, the hydrogen assumes a molecular state.

Thus, the present invention permits fabrication of TFTs having electrical characteristics better than those of conventional TFTs. Also, a liquid crystal display of higher performance can be manufactured, using TFTs fabricated by this technique.

What is claimed is:

1. A semiconductor device comprising:
   a substrate comprising one selected from the group consisting of a glass, a quartz, and a semiconductor material;
   a buffer layer provided on said substrate;
   a semiconductor layer provided on said buffer layer and comprising a source region, a drain region and a channel forming region which is provided between said source region and said drain region; and
   a gate electrode provided over said substrate and adjacent to said channel forming region with a gate insulating film interposed between said channel forming region and said gate electrode,
   wherein said buffer layer and said substrate have hydrogen containing regions.

2. The device of claim 1 wherein said semiconductor layer is a semiconductor island, and said hydrogen containing region is provided under said semiconductor island.

3. The device of claim 1 further comprising an interlayer insulating film provided over said channel forming region and said gate electrode and comprising silicon oxide or silicon nitride.

4. The device of claim 1 wherein said buffer layer comprises silicon oxide.

5. A semiconductor device comprising:
   a substrate comprising one selected from the group consisting of a glass, a quartz, and a semiconductor material;
   a buffer layer provided on said substrate;
   a semiconductor layer provided on said buffer layer and comprising a source region, a drain region and a channel forming region which is provided between said source region and said drain region; and
   a gate electrode provided over said substrate and adjacent to said channel forming region with a gate insulating film interposed between said channel forming region and said gate electrode,
   wherein said buffer layer and said substrate have hydrogen containing regions, and said substrate has a concentration peak of said hydrogen.

6. The device of claim 5 further comprising an interlayer insulating film provided over said channel forming region and said gate electrode and comprising silicon oxide or silicon nitride.

7. The device of claim 2 wherein said buffer layer comprises silicon oxide.

8. A semiconductor device comprising:
   a substrate;
   a buffer layer provided on said substrate;
   a semiconductor layer provided over said buffer layer and comprising a source region and a drain region and a channel forming region which is provided between said source region and said drain region; and
   a gate electrode provided over said buffer layer and adjacent to said channel forming region with a gate insulating film interposed between said channel forming region and said gate electrode,
   wherein said buffer layer and said substrate have hydrogen containing regions.

9. The device of claim 8 wherein said semiconductor layer comprises a semiconductor island, and said hydrogen containing region is provided under said semiconductor island.

10. The device of claim 8 further comprising an interlayer insulating film provided over said channel forming region and said gate electrode and comprising silicon oxide or silicon nitride.

11. The device of claim 8 wherein said buffer layer comprises silicon oxide.

12. The device of claim 8 wherein said substrate comprises one selected from the group consisting of a glass, a quartz, and a semiconductor material.

13. A semiconductor device comprising:
   a substrate comprising one selected from the group consisting of a glass, a quartz, and a semiconductor material, said substrate having at least a pixel region of an active matrix type display device;
   a buffer layer provided on said substrate;
   a semiconductor island provided on said buffer layer and comprising a source region, a drain region and a channel forming region which is provided between said source region and said drain region; and
   a gate electrode provided over said substrate and adjacent to said channel forming region with a gate insulating film interposed between said channel forming region and said gate electrode,
   wherein said buffer layer and said substrate have hydrogen containing regions.

14. The device of claim 13 further comprising an interlayer insulating film provided over said channel forming region and said gate electrode and comprising silicon oxide or silicon nitride.

15. The device of claim 13 wherein said buffer layer comprises silicon oxide.

16. A semiconductor device comprising:
- a substrate comprising one selected from the group consisting of a glass, a quartz, and a semiconductor material, said substrate having at least a driver circuit of an active matrix type display device;
- a buffer layer provided on said substrate;
- a semiconductor island provided on said buffer layer and comprising a source region, a drain region and a channel forming region which is provided between said source region and said drain region; and
- a gate electrode provided over said substrate and adjacent to said channel forming region with a gate insulating film interposed between said channel forming region and said gate electrode,
- wherein said buffer layer and said substrate have hydrogen containing regions.

17. The device of claim 16 further comprising an interlayer insulating film provided over said channel forming region and said gate electrode and comprising silicon oxide or silicon nitride.

18. The device of claim 16 wherein said buffer layer comprises silicon oxide.

19. A semiconductor device comprising:
- a substrate having at least a pixel region of an active matrix type display device;
- a buffer layer provided on said substrate;
- a semiconductor layer provided on said buffer layer and comprising a source region and a drain region and a channel forming region which is provided between said source region and said drain region; and
- a gate electrode provided over said buffer layer and adjacent to said channel forming region with a gate insulating film interposed between said channel forming region and said gate electrode,
- wherein said buffer layer and said substrate have hydrogen containing regions.

20. The device of claim 19 wherein said semiconductor layer comprises a semiconductor island, and said hydrogen containing region is provided under said semiconductor island.

21. The device of claim 19 further comprising an interlayer insulating film provided over said channel forming region and said gate electrode and comprising silicon oxide or silicon nitride.

22. The device of claim 19 wherein said buffer layer comprises silicon oxide.

23. The device of claim 19 wherein said substrate comprises one selected from the group consisting of a glass, a quartz, and a semiconductor material.

24. A semiconductor device comprising:
- a substrate having at least a driver circuit of an active matrix type display device;
- a buffer layer provided on said substrate;
- a semiconductor layer provided on said buffer layer and comprising a source region and a drain region and a channel forming region which is provided between said source region and said drain region; and
- a gate electrode provided over said buffer layer and adjacent to said channel forming region with a gate insulating film interposed between said channel forming region and said gate electrode,
- wherein said buffer layer and said substrate have hydrogen containing regions.

25. The device of claim 24 wherein said semiconductor layer comprises a semiconductor island, and said hydrogen containing region is provided under said semiconductor island.

26. The device of claim 24 further comprising an interlayer insulating film provided over said channel forming region and said gate electrode and comprising silicon oxide or silicon nitride.

27. The device of claim 24 wherein said buffer layer comprises silicon oxide.

28. The device of claim 24 wherein said substrate comprises one selected from the group consisting of a glass, a quartz, and a semiconductor material.

* * * * *